United States Patent
Szyszka et al.

(10) Patent No.: US 6,797,128 B1
(45) Date of Patent: Sep. 28, 2004

(54) METHOD FOR REGULATING SPUTTERING PROCESSES

(75) Inventors: Bernd Szyszka, Braunschweig (DE); Niels Malkomes, Braunschweig (DE)

(73) Assignee: Fraunhofer-Gesellschaft zur Forderung der Angewandten Forschung e.V., Munich (DE)

( * ) Notice: Subject to any disclaimer, the term of this patent is extended or adjusted under 35 U.S.C. 154(b) by 0 days.

(21) Appl. No.: 10/148,099

(22) PCT Filed: Nov. 2, 2000

(86) PCT No.: PCT/EP00/10782
§ 371 (c)(1),
(2), (4) Date: Jul. 29, 2002

(87) PCT Pub. No.: WO01/38597
PCT Pub. Date: May 31, 2001

(30) Foreign Application Priority Data

Nov. 25, 1999 (DE) .......................... 199 56 733

(51) Int. Cl.[7] ............................................. C23C 14/34
(52) U.S. Cl. ........................... 204/192.13; 204/192.12; 204/298.03
(58) Field of Search ....................... 204/192.12, 192.13, 204/298.03

(56) References Cited

U.S. PATENT DOCUMENTS

| | | | |
|---|---|---|---|
| 5,292,417 A | 3/1994 | Kugler | 204/192.13 |
| 5,492,606 A | 2/1996 | Stauder et al. | 204/192.12 |
| 5,556,520 A | 9/1996 | Latz | 204/192.13 |
| 5,770,922 A | 6/1998 | Gerrish et al. | 315/111.21 |
| 5,939,886 A | 8/1999 | Turner et al. | 324/464 |
| 6,132,563 A | 10/2000 | Frach et al. | 204/192.13 |

FOREIGN PATENT DOCUMENTS

| | | |
|---|---|---|
| CA | 2184432 | 8/1996 |
| DE | 44 10 258 A1 | 10/1994 |
| DE | 195 06 515 C1 | 3/1996 |
| DE | 195 37 212 A1 | 4/1996 |
| DE | 197 21 676 A1 | 7/1996 |
| DE | 196 05 932 A1 | 8/1997 |
| DE | 198 00 758 A1 | 7/1999 |
| EP | 0 501 016 A1 | 9/1992 |
| EP | 0 508 359 B1 | 10/1992 |
| EP | 0 299 754 B1 | 10/1993 |
| EP | 0 605 299 B1 | 9/1997 |
| EP | 0 795 623 A1 | 9/1997 |
| GB | 2 276 635 A | 10/1994 |
| WO | 9914699 | * 3/1999 |

OTHER PUBLICATIONS

Affinito, J. et al., "Mechanisms of voltage controlled, reactive, planar magnetron sputtering of Al in Ar/N2 and Ar/O2 atmosphere," J. Vac. Sci. Technol. A2(3), Jul.–Sep. 1984, pp. 1275–1284.

Sobolewski, M. A. et al., Electrical measurements for monitoring and control of rf plasma processing,: SPIE, vol. 1803, 1992, pp. 309–320.

S. Schiller, U. Heisig, Chr. Korndörfer, G. Beister, J. Reschke, K. Steinfelder and J. Strümpfel, "Reactive D.C. High–Rate Sputtering as Production Technology", Surface and Coatings Technology, 33 (1987) 405–423.

* cited by examiner

Primary Examiner—Rodney G. McDonald
(74) Attorney, Agent, or Firm—Barnes & Thornburg

(57) ABSTRACT

The invention relates to a method for regulating MF or HF sputtering processes, a harmonic analysis of the electrical discharge parameters being implemented and the MF or HF output and/or the reactive gas flow being regulated on the basis of the analysis results.

20 Claims, 6 Drawing Sheets

METHOD FOR REGULATING SPUTTERING PROCESSES

CROSS-REFERENCE TO RELATED APPLICATIONS

This application is a U.S. national counterpart application of international application serial no. PCT/EP00/10782 filed Nov. 2, 2000, which claims priority to German application serial No. 199 56 733.6 filed Nov. 21, 1999.

The present invention relates to a method for regulating MF or HF sputtering processes. Plasma sputtering is an established technology for coating substrates, in particular with ceramic or other multi-component functional layers. Sputtering, in particular reactive magnetron sputtering, is based on sputtering of metallic targets in a reactive atmosphere with the aim of allowing the desired combination of desired microstructure and phase composition to grow on the substrate at a high rate.

A substantial problem results therefrom however in that the reactive gas partial pressure in conventional sputtering processes cannot be altered continuously. The parameter range therefore breaks down into the defined ranges "compound mode", with high reactive gas partial pressure and a target surface covered completely with reaction products and also with stoichiometric layers on the substrate, and with a "metallic mode" with a low reactive gas partial pressure in the sputtering chamber, an extensively metallic target surface and with growth of metallic layers on the substrate. Between these ranges, a continuous transition is in general not possible but rather unstable process conditions result, the materialisation of which is outlined in the following. For example, reference is made thereby to the reactive gas $O_2$, however the mentioned mechanisms apply also for sputtering in $N_2$, $CH_x$ and the like.

At the beginning of the magnetron sputtering, reactive gas is added into the sputtering chamber. Then competing growth and etching processes take their course on the target surface. With a low $O_2$ partial pressure, the rate for the growth of the oxide covering is low, so that the etching process predominates by the sputtering removal of the oxide layer. The target surface remains therefore in total metallic. This state is stable since the target operates as an efficient getter pump, the effective suction capacity of which often is a multiple of the suction capacity of the turbo pump which is actually used for evacuation.

If the reactive gas partial pressure is increased, then an oxide layer grows on the target surface at a somewhat higher rate. In the case of low ion flow densities and hence a low etching rate, the growth process then predo minates. In this manner, target regions covered with reaction products are produced which are also described as "poisoned target regions".

These poisoned target regions always have a lower sputtering yield relative to the metal so that altogether less target material is sputtered. This leads to a reduction in the material removal on the target, a lowering of the target suction capacity and hence to a further increase in the reactive gas partial pressure.

As soon as the reactive gas partial pressure exceeds a critical value, the consequence is a self-increasing effect, since the increase in the reactive gas partial pressure results in a reduction in the suction capacity of the target getter pump, as a result of which an increase in the reactive gas partial pressure results in turn. This instability characterises the transition from the metallic mode into the compound mode.

Precisely the stabilisation of the discontinuous transition between these two states is technically of great interest now since, on the one hand, the growth rate in the compound mode conditioned by the low sputtering yield is only low but, on the other hand, the layers in the compound mode grow with reactive gas excess, as a result of which unfavourable layer properties result. On the other hand, the reactive gas partial pressure is generally too low in the metallic mode so that absorbing substoichiometric compounds then grow.

The desired stoichiometric layers can however be deposited at a higher rate when the process is operated precisely in the unstable transition range which is described also as "transition mode". The stabilisation of this discontinuous transition state "transition mode" is possible by means of control cycles which take into account the dynamic behaviour of the sources and which thus can maintain the technically interesting unstable operating points.

Various control variables are proposed in the state of the art in order to stabilise the transition mode.

It is known for example from J. Affinito, R. R. Parsons, "Mechanisms of voltage controlled, reactive, planar magnetron sputtering of Al in $Ar/N_2$ and $Ar/O_2$ atmospheres", J. Vac. Sci. Technol. A 2 (1984) 1275, for materials such as ZnO, $SnO_2$ or $SiO_2$ in which the plasma impedance depends significantly upon the target covering, that the plasma impedance is maintained constant as a control variable by adaptation of the discharge output of the reactive gas flow (impedance control). Alternatively, it was proposed by EP 0 795 623 A1 (publication 17/09/1997) that, in oxidic systems, in which the plasma impedance depends only slightly upon the target covering so that the impedance regulation fails as for example for $TiO_2$, $Nb_2O_5$, the reactive gas partial pressure is used as control variable which is determined via lambda probes.

The dissertation by J. Strümpfel, "Process stabilisation with reactive high rate sputtering by means of optical emission spectroscopy for industrial production of indium-tin oxide layers and titanium dioxide layers", Chemnitz, 1991, describes the use of the optical emission of the plasma discharge as control variable as a further possibility. A combination of the above mentioned methods from the state of the art is also usable. All the above mentioned methods are also in principle usable both in the direct voltage and in MF operation.

All the known methods from the state of the art calculate absolute values. Such a calculation of absolute values is however very problematic in production conditions. Because, for example the plasma impedance is changed by target erosion, by contamination of the measuring heads, by random layers and the like.

It is therefore the object of the present invention to indicate a method for controlling sputtering processes by means of which the transition between the different operating modes, as described above, can be reliably stabilised.

This object is achieved by the method according to claim 1 and the device according to claim 7. Advantageous developments of the method according to the invention are given in the dependent claims.

The present invention presents a new method for plasma diagnostics and characterisation of the target state via the harmonic analysis of electrical discharge parameters. Included herein is for example the analysis of the complex Fourier spectrum of electrical discharge parameters, such as cathodic current or cathodic voltage. Hence, new possibilities for process regulation are created. The harmonic oscillation components of current and voltage, the phase displacement between current and voltage at the fundamental frequency and/or at higher frequencies or also the ratios of the Fourier coefficients of current and voltage of the cathode are possible as adjustable variable.

The particular advantage of the method according to the invention resides in being able to determine the target state without there being a requirement for precisely determining absolute values.

In the following, a few examples of the method according to the invention are described.

DETAILED DESCRIPTION OF THE DRAWINGS

Figure 1:
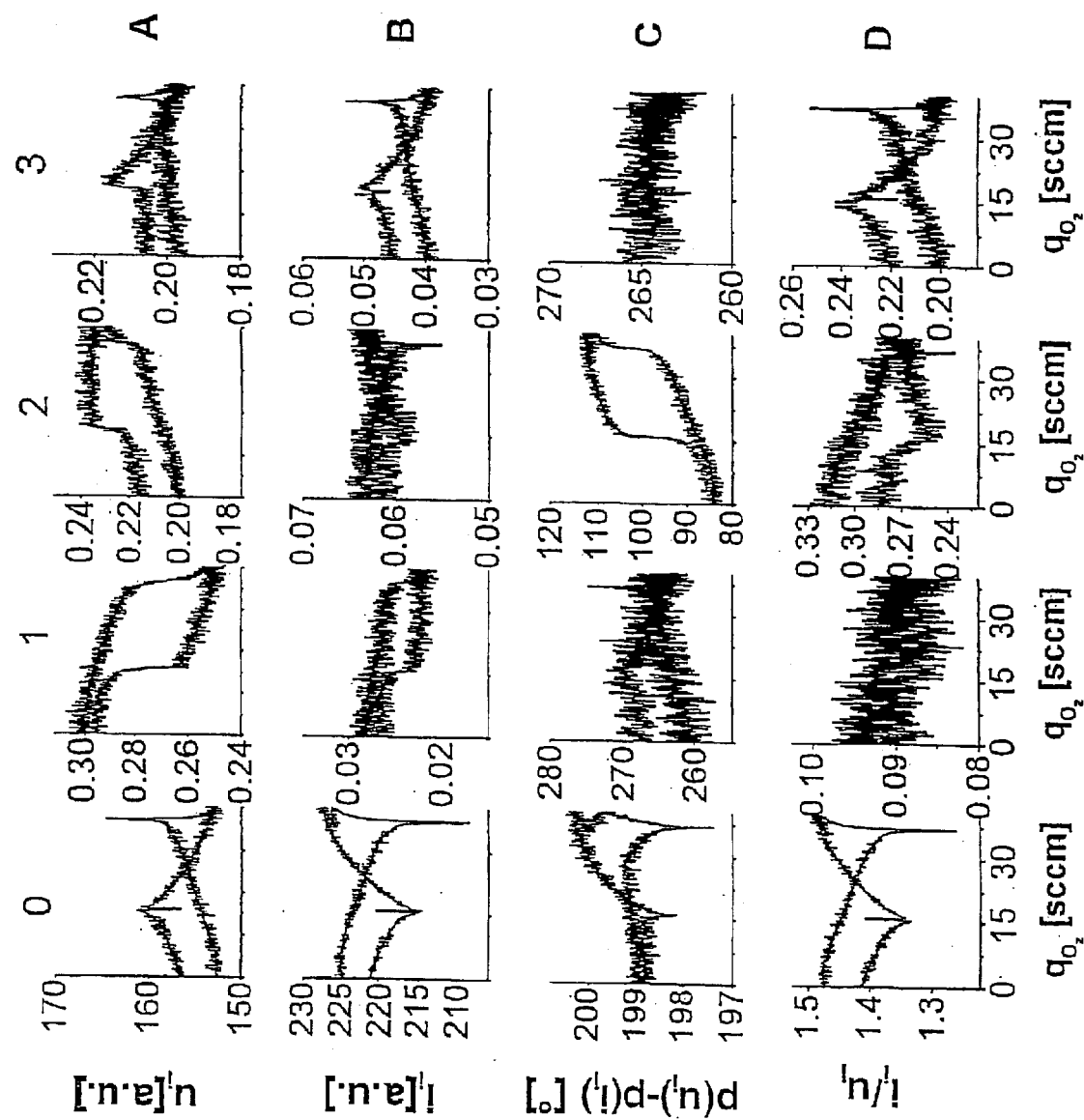
FIGS. 1 and 2 show the harmonic analysis and the $U(q_{o2})$ hysteresis curve during reactive magnetron sputtering of $TiO_x$ layers.
Figure 2:
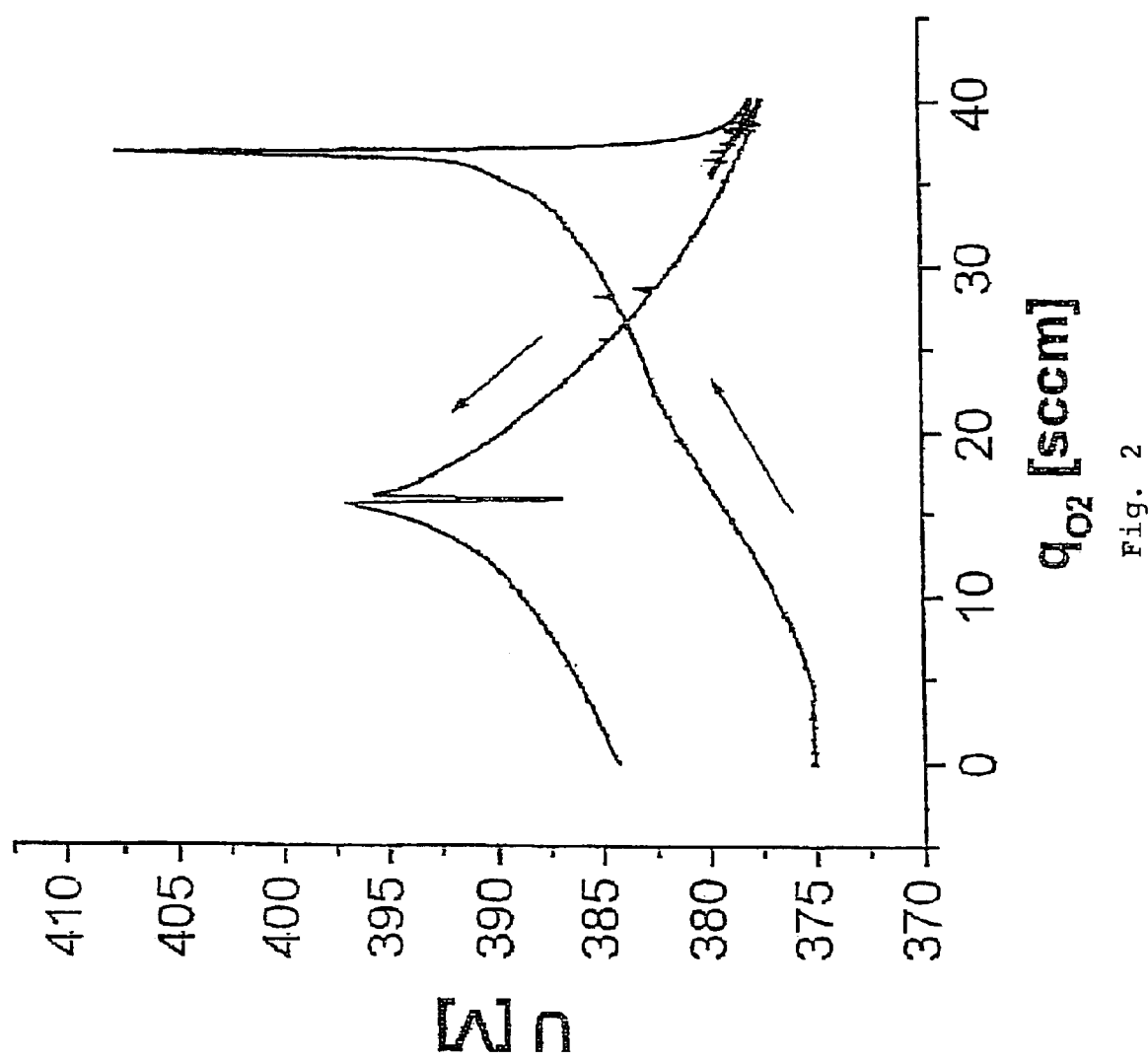

In the following, the results of observation of the electrical parameters of the discharge for the reactive magnetron sputtering of $TiO_x$ layers are described. FIG. 1 thereby shows the harmonic analysis of hysteresis during reactive average frequency magnetron sputtering of $TiO_x$ layer systems. The implementation of the process is effected at a constant output of P=6 kW corresponding to an output density of $P/A=7\ W/cm^2$ and at a constant Ar flow of $q_{Ar}=60$ sccm. Beginning from metallic targets, the $O_2$ flow was increased or lowered continuously in the range of $q_{O2}= 0 \ldots 40$ sccm. The lines A–D of the matrix represent the Fourier coefficients of current and voltage $u_j$ and $i_j$, the phase displacement between voltage and current $p(u_i)-p(i)_i$ and the ratio of the Fourier coefficients $i_j/u_j$. Columns 0–3 describe the data for the fundamental oscillation and the first to third harmonic oscillation.

The reactive sputtering of $TiO_x$ layer systems is classically not impedance-regulatable since there is no monotonic correlation between the discharge voltage and the target state. Drawing 2 shows in this regard the $U(q_{o2})$ characteristic line for the process examined above in FIG. 1 by means of harmonic analysis.

The curve corresponds substantially to the fundamental oscillation $u_o$, which is illustrated in FIG. 1, the transition between the operating states, metallic mode and oxide mode, is effected at $q_{o2}=37$ sccm or $q_{o2}$ 16 sccm, the target state cannot be identified unequivocally by means of the discharge voltage.

Harmonic analysis offers such unequivocal assignments for some of the values plotted in FIG. 1. In particular, analysis of the phase displacement of voltage and current of the second harmonic oscillation is offered for stabilisation of the $TiO_x$ process (drawing C2 of the matrix in FIG. 1). This value is particularly suitable because of its high signal travel and because of the low noise as control variable for stabilisation of the process.

The information content of the harmonic analysis is determined by several material and process parameters so that the optimal control variable can be determined by means of separate examinations in the respective individual case in the manner which is familiar to the expert.

In a further embodiment, a reactive MF sputtering process for $Nb_2O_5$ is stabilised by means of determination of the first harmonic oscillation of the target voltage. The technical conversion was hereby effected with a one-phase lock-in amplifier, the reference and signal input of which was supplied with the target voltage. By means of the operation in 2F mode, the harmonic oscillation component of the target voltage was emitted by the lock-in amplifier. This harmonic oscillation component was standardised to the target voltage delivered from the generator so that in a first approximation the standardised Fourier coefficient was measured during the first harmonic oscillation. Next this control variable was stabilised during constant oxygen supply (25 sccm), the electric output at the cathode being varied as the adjustable variable.

Figure 3:
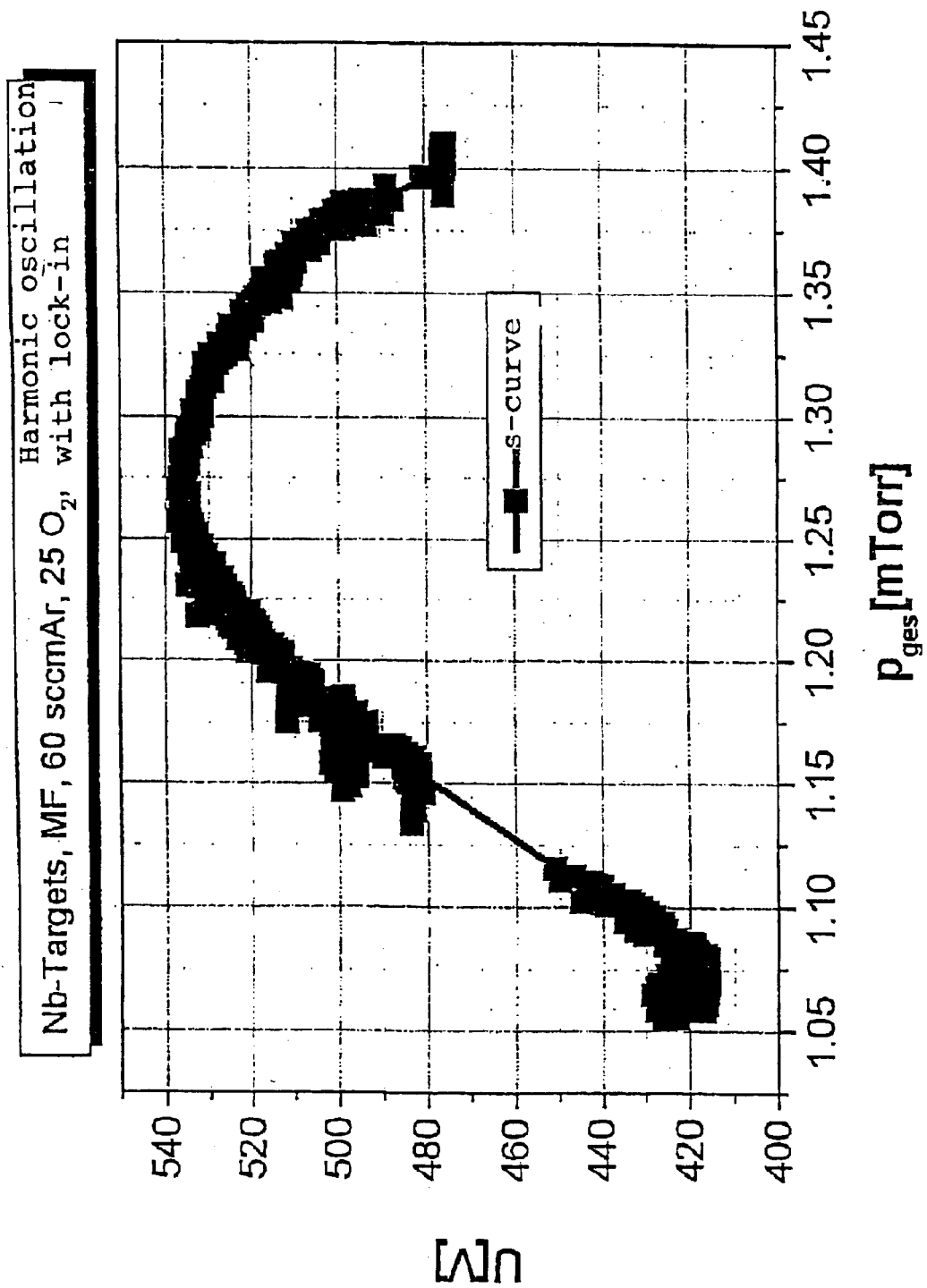
FIGS. 3 and 4 show the dependence of an adjustable variable upon the overall pressure in the sputtering chamber in the case of $Nb_2O_5$ sputtering.

FIG. 3 shows the dependence of the discharge voltage upon the overall pressure in the sputtering chamber. As can be detected, the characteristic line has no monotonic correlation. Since there is no monotonic relation between the discharge parameters and the layer properties or the reactive partial pressure, the reactive $NbO_x$ sputtering process is not impedance-regulatable.

Figure 4:
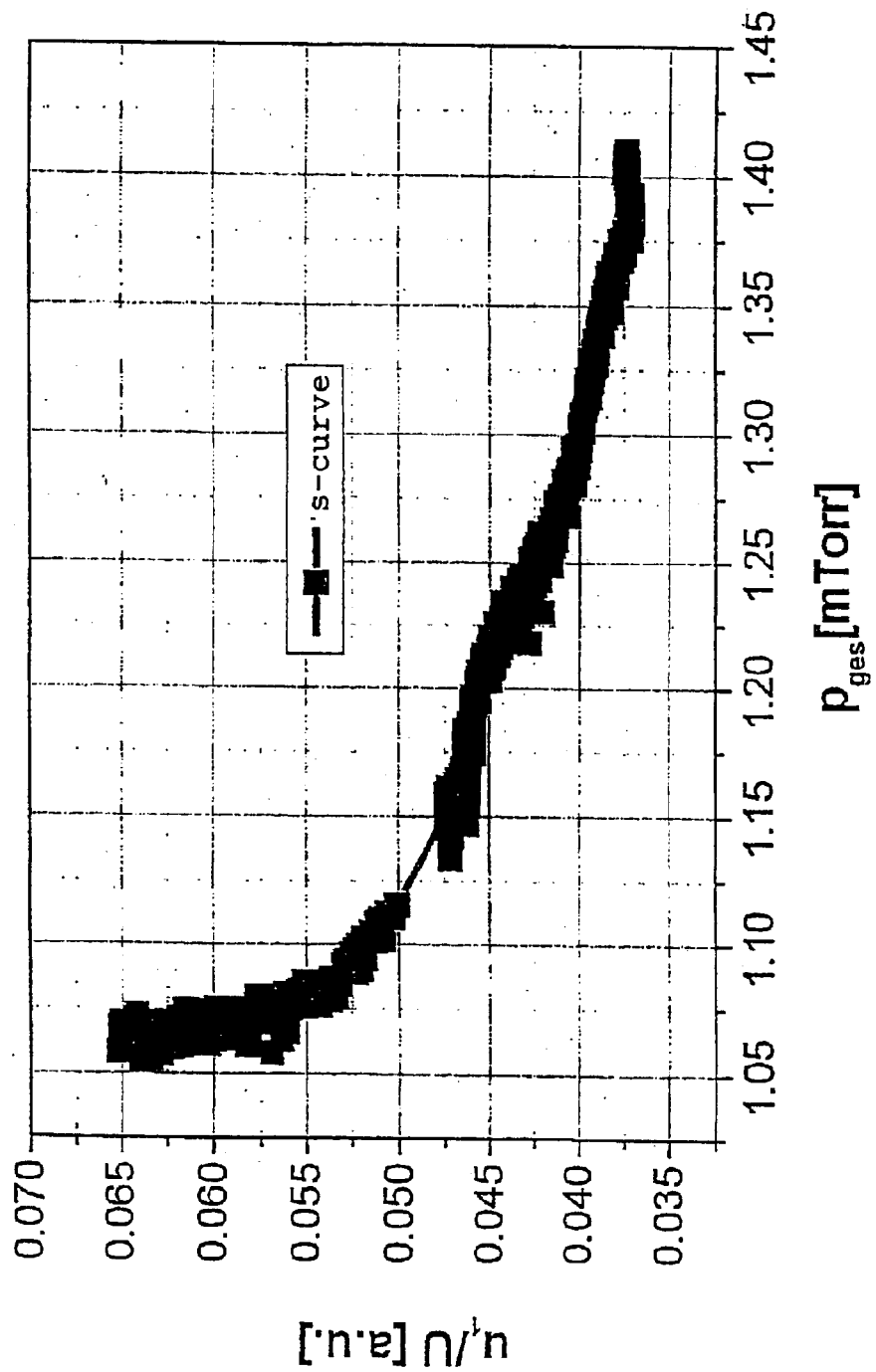

FIG. 4 illustrates in contrast the dependence of the standardised Fourier coefficient u1/U as described above upon the total pressure u1/U. u1 thereby describes the amplitude of the first harmonic oscillation of the course of the target voltage $U_{(t)}$, which is measured at the target, U being the average value of the voltage given by the generator. It can be detected here that this standardised Fourier coefficient and the total pressure have a monotonic correlation. Consequently, it is possible with this control variable to produce layers in the transition mode with continuously changeable reactive gas partial pressure.

Figure 5:
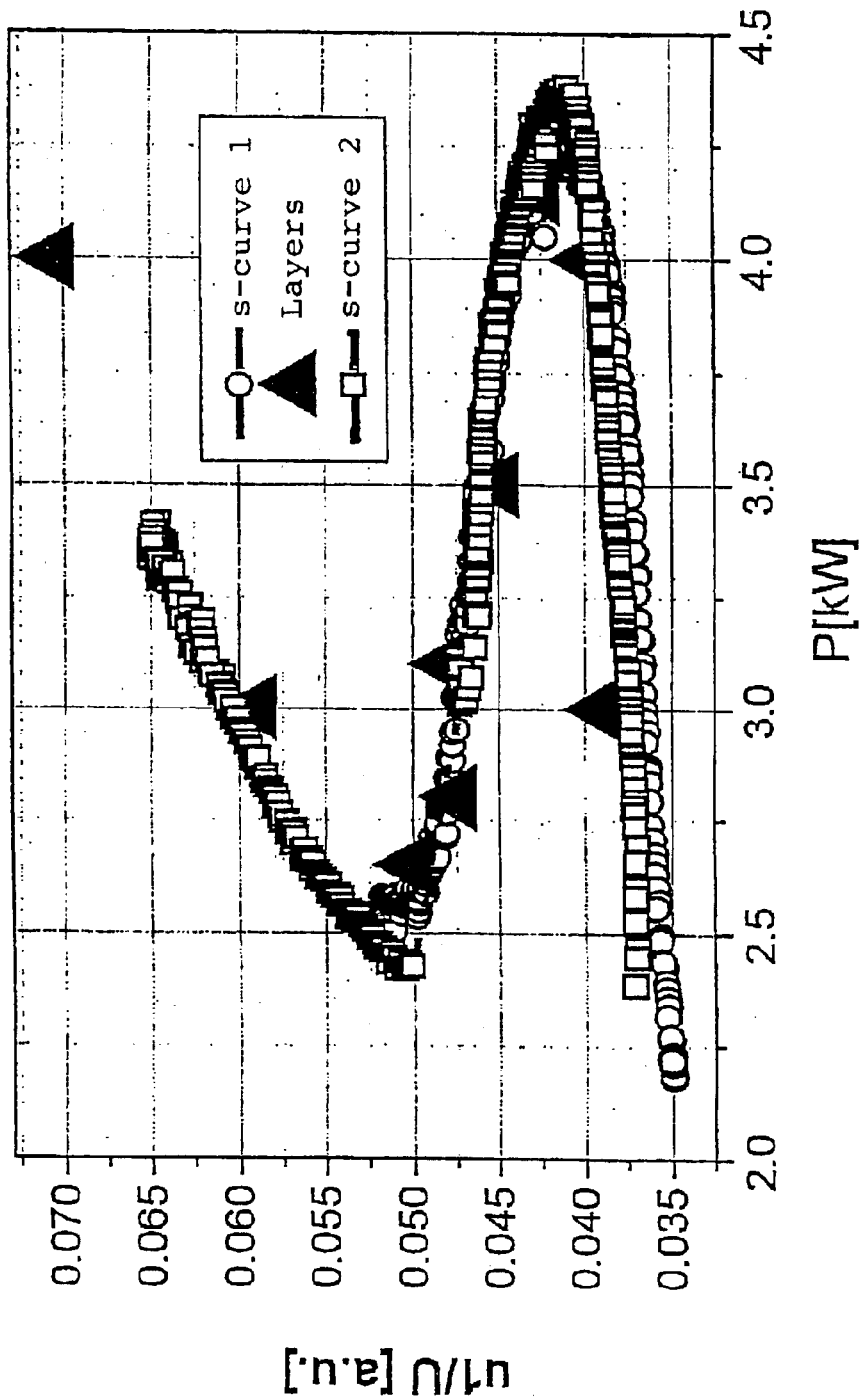
FIG. 5 shows the dependence of the standardised Fourier coefficient u1/U upon the discharge output during $Nb_2O_5$ sputtering.

FIG. 5 showed the characteristic line of the dependence of the standardised Fourier coefficient u1/U upon the discharge output. The typical S-configuration of the characteristic line is detected. There is no discontinuous transition and hence the discharge at each operating point can be stabilised.

In FIG. 5, the operating points are furthermore recorded at which layers were produced from $NbO_x$ (filled triangles).

Figure 6:
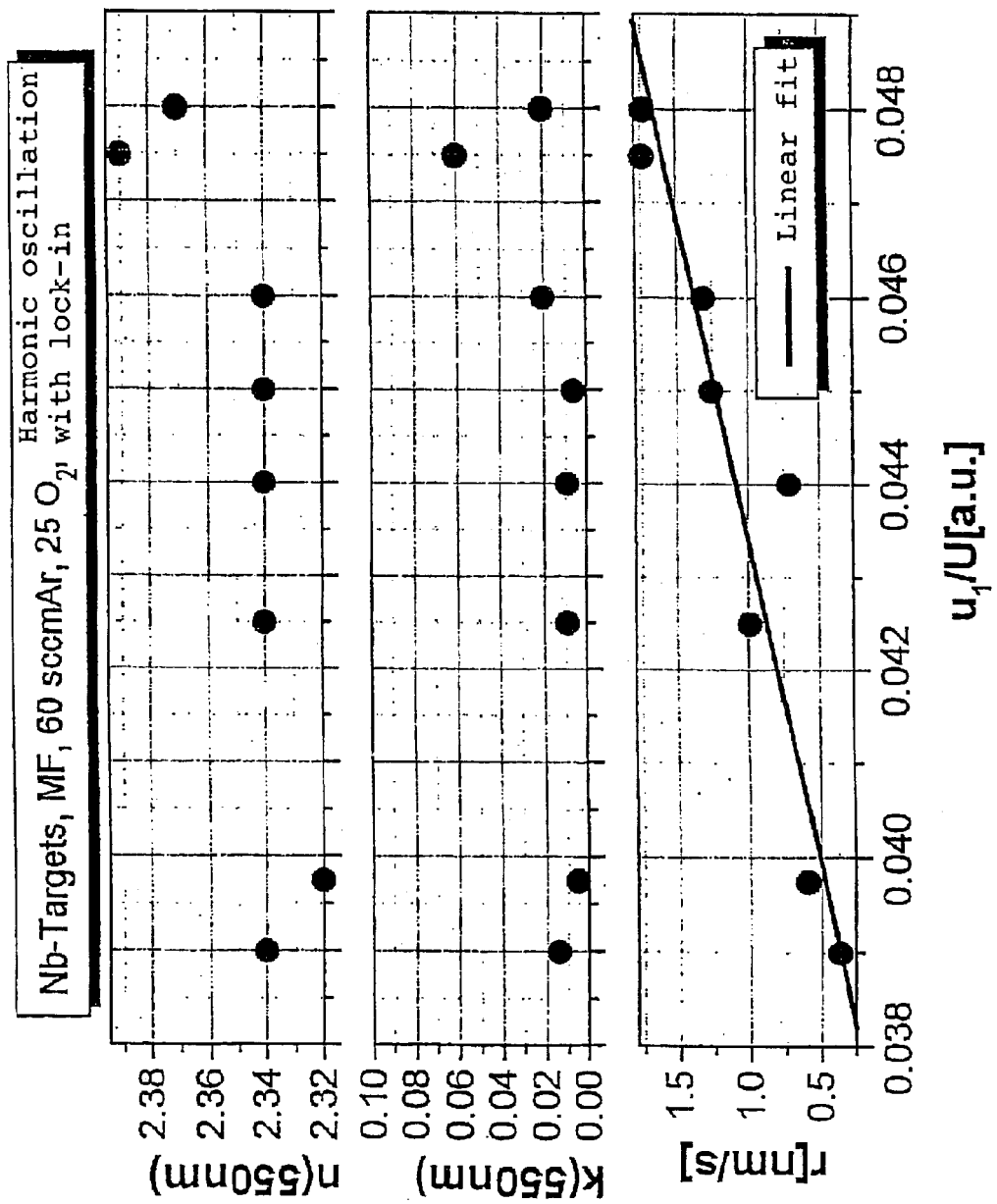
FIG. 6 shows the illustration of refractive index n, absorption coefficient k and deposition rate a of the standardised Fourier coefficients u1/U during $Nb_2O_5$ sputtering.

FIG. 6 shows the optical constants, refractive index n and absorption index k, and also the deposition rate a of the samples which were produced at the marked operating points of FIG. 3. As can be detected, the samples begin to absorb above a value of u1/U of approximately 0.047. Transparent layers were produced for u1/U=0.046 at a high deposition rate of a=1.25 nm/s in the unstable parameter range of the central branch of the S-curve of FIG. 5.

The values at 0.044 and 0.048 should be regarded as outliers.

It remains here to be noted that the regulation in this case operated on only one cathode, so that the second cathode was able to have a slightly different state, which however changed nothing about the principle function of the regulation.

In summary, it can be established that for the first time a method for stabilising the reactive MF magnetron sputtering and also HF or MF sputtering in the so-called transition range is made available, which method is based on the harmonic analysis of the electrical parameters.

What is claimed is:

1. A method for regulating at least one of MF and HF reactive magnetron sputtering processes by stabilizing the transition between different target states, the method including conducting a harmonic analysis of electrical discharge parameters and regulating at least one of MF and HF output and reactive gas flow on the basis of the harmonic analysis results so as to stabilize a target state in a transition mode between operation states metallic mode and oxide mode.

2. The method of claim 1 further including calculating a control variable from the harmonic analysis results and regulating the at least one of the MF and HF output such that the control variable adopts its set point.

3. The method of claim 1 further including implementing a harmonic analysis of at least one of a complex Fourier spectrum of an electrical discharge current and an electrical discharge voltage.

4. The method of claim 1 further including implementing an analysis of a phase displacement between an electrical discharge current and an electrical discharge voltage at at least one of the fundamental frequency and a harmonic of a fundamental frequency.

5. The method of claim 1 further including implementing an analysis of ratios of Fourier coefficients of at least one of an electrical discharge current and electrical discharge voltage.

6. The method of claim 1 wherein calculating a control variable from harmonic analysis results and regulating the at least one of the MF and HF output such that the control variable adopts its set point includes calculating a Fourier coefficient of a first harmonic oscillation of an electrical discharge voltage and regulating the at least one of the MF and HF output such that the control variable adopts its set point.

7. The method of claim 2 further including implementing a harmonic analysis of at least one of the complex Fourier spectrum of an electrical discharge current and an electrical discharge voltage.

8. The method of claim 2 further including implementing an analysis of a phase displacement between the electrical discharge current and an electrical discharge voltage at at least one of a fundamental frequency and a harmonic of the fundamental frequency.

9. The method of claim 3 further including implementing an analysis of a phase displacement between an electrical discharge current and an electrical discharge voltage at at least one of the fundamental frequency and a harmonic of the fundamental frequency.

10. The method of claim 7 further including implementing an analysis of a phase displacement between an electrical discharge current and the electrical discharge voltage at at least one of a fundamental frequency and a harmonic of the fundamental frequency.

11. The method of claim 2 further including implementing an analysis of ratios of Fourier coefficients of at least one of an electrical discharge current and an electrical discharge voltage.

12. The method of claim 3 further including implementing an analysis of ratios of Fourier coefficients of at least one of the electrical discharge current and the electrical discharge voltage.

13. The method of claim 4 further including implementing an analysis of ratios of Fourier coefficients of at least one of the electrical discharge current and the electrical discharge voltage.

14. The method of claim 7 further including implementing an analysis of ratios of Fourier coefficients of at least one of the electrical discharge current and the electrical discharge voltage.

15. The method of claim 8 further including implementing an analysis of ratios of Fourier coefficients of at least one of the electrical discharge current and the electrical discharge voltage.

16. The method of claim 9 further including implementing an analysis of ratios of Fourier coefficients of at least one of the electrical discharge current and the electrical discharge voltage.

17. The method of claim 10 further including implementing an analysis of ratios of Fourier coefficients of at least one of the electrical discharge current and the electrical discharge voltage.

18. The method of claim 2 wherein calculating a control variable from the harmonic analysis results and regulating the at least one of the MF and HF output such that the control variable adopts its set point includes calculating a Fourier coefficient of a first harmonic oscillation of an electrical discharge voltage and regulating the at least one of the MF and HF output such that the control variable adopts its set point.

19. The method of claim 3 wherein calculating a control variable from the harmonic analysis results and regulating the at least one of the MF and HF output such that the control variable adopts its set point includes calculating Fourier coefficient of a first harmonic oscillation of the electrical discharge voltage and regulating the at least one of the MF and HF output such that the control variable adopts its set point.

20. A system for implementing a stabilized transition between different states of a target in at least one of MF and HF reactive magnetron sputtering, the system including a sputtering chamber in which said target to be sputtered is disposed, a cathode, a generator for producing at the cathode at least one of an MF and HF voltage, and a device for implementing a harmonic analysis of an electrical discharge parameter of at least one of the cathode and the generator.

* * * * *